(12) United States Patent
McAdams et al.

(10) Patent No.: US 7,898,837 B2
(45) Date of Patent: Mar. 1, 2011

(54) F-SRAM POWER-OFF OPERATION

(75) Inventors: Hugh P. McAdams, McKinney, TX (US); Scott R. Summerfelt, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 120 days.

(21) Appl. No.: 12/507,449

(22) Filed: Jul. 22, 2009

(65) Prior Publication Data

US 2011/0019461 A1 Jan. 27, 2011

(51) Int. Cl.
*G11C 11/22* (2006.01)

(52) U.S. Cl. .................. 365/145; 365/117; 365/149; 365/189.04

(58) Field of Classification Search .......... 365/145, 365/117, 149, 189.04
See application file for complete search history.

(56) References Cited

U.S. PATENT DOCUMENTS 6,809,949 B2 * 10/2004 Ho ........................... 365/145
7,149,137 B2 * 12/2006 Rodriguez et al. .......... 365/201
7,212,427 B2 * 5/2007 Ho ............................. 365/145

OTHER PUBLICATIONS

Masui et al., "A Ferroelectric Memory-Based Secure Dynamically Programmable Gate Array," IEEE J. Solid-State Circuits; vol. 38; p. 715; May 2003.

* cited by examiner

*Primary Examiner*—Pho M Luu
(74) *Attorney, Agent, or Firm*—Rose Alyssa Keagy; Wade J. Brady, III; Frederick J. Telecky, Jr.

(57) ABSTRACT

A process of operating an integrated circuit containing a programmable data storage component including at least one data ferroelectric capacitor and at least one additional ferroelectric capacitor, in which power is removed from a state circuit after each read operation. A process of operating an integrated circuit containing a programmable data storage component including at least one data ferroelectric capacitor and at least one additional ferroelectric capacitor, in which power is removed from a state circuit after each write operation. A process of operating an integrated circuit containing a programmable data storage component including four data ferroelectric capacitors, in which power is removed from a state circuit after each read operation and after each write operation.

20 Claims, 2 Drawing Sheets

F-SRAM POWER-OFF OPERATION

FIELD OF THE INVENTION

This invention relates to the field of integrated circuits. More particularly, this invention relates to ferroelectric memory elements in integrated circuits.

DESCRIPTION OF THE VIEWS OF THE DRAWING

FIG. 1 is a circuit diagram of a programmable data storage component containing two complementary state nodes and at least two ferroelectric capacitors.

FIG. 2 is a flowchart of a write operation according to an embodiment.

FIG. 3 is a flowchart of a read operation according to an embodiment.

DETAILED DESCRIPTION

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Ferroelectric capacitors in a programmable data storage component may be described as data ferroelectric capacitors or load ferroelectric capacitors. Data ferroelectric capacitors are connected to plate nodes which are pulsed during recall operations. Load ferroelectric capacitors are connected to plate nodes which are statically biased during recall operations.

The term "programming" is understood to refer to a process of polarizing ferroelectric capacitors in a ferroelectric static random access memory (F-SRAM) cell so as to provide data retention when power is removed from the F-SRAM cell. The term "recall" is understood to refer to a process of biasing ferroelectric capacitors in an F-SRAM cell which has been programmed so that the F-SRAM cell is in the programmed data state when power is applied to the F-SRAM cell.

For the purposes of this disclosure, the term "Vdd" is understood to refer to a power supply node with a potential suitable for source nodes of p-channel metal oxide semiconductor (PMOS) transistors. Similarly, the term "Vss" is understood to refer to a power supply node with a potential suitable for source nodes of n-channel metal oxide semiconductor (NMOS) transistors, and is lower than the Vdd potential. The term "floated" is understood to mean disconnected from a voltage source such as Vdd or Vss, or connected to a voltage source through a high impedance, for example a transistor, a resistor or a diode, so as to limit charge accumulation on a floated node.

An integrated circuit containing a programmable data storage component, which may be for example an F-SRAM cell or a logic latch, in which data ferroelectric capacitors are directly connected to state nodes of a state circuit in the programmable data storage component, may be operated by powering down the programmable data storage component after every read and write operation. Write operations are combined with subsequent programming operations to maintain data after the programmable data storage component is powered down. Read operations are combined with preceding recall operations to restore data after the programmable data storage component is powered up from a previous power down step.

FIG. 1 is a circuit diagram of a programmable data storage component (1000) containing two complementary state nodes and at least two ferroelectric capacitors. A first state node (1002) and a second state node (1004) are complementary state nodes coupled by a state circuit (1006) which may be a pair of cross-coupled inverters as depicted in FIG. 1, or may be another realization of a circuit with two complementary state nodes. Vdd is applied to the state circuit (1006) through a Vdd node (1008), and Vss is applied to the state circuit (1006) through a Vss node (1010). The programmable data storage component (1000) contains a first data ferroelectric capacitor (1012) which is coupled to the first state node (1002), possibly through a first optional isolation transistor (1014), and through one of a first optional CMOS switch (1016) or a first optional direct connection (1018). In one realization of the instant embodiment, the programmable data storage component (1000) may contain an optional first auxiliary ferroelectric capacitor (1020), which may be a data ferroelectric capacitor or a load ferroelectric capacitor, coupled to the first state node (1002), possibly through a first optional load capacitor isolation transistor (1022). In another realization, the programmable data storage component (1000) may contain a first optional load (1024) coupled to the first data ferroelectric capacitor (1012), possibly including a first optional load transistor (1026), a first optional load capacitor (1028) or a first optional load resistor (1030).

The programmable data storage component (1000) may contain an optional second data ferroelectric capacitor (1032) coupled to the second state node (1004) possibly through a second optional isolation transistor (1034), and through one of a second optional CMOS switch (1036) or a second optional direct connection (1038). In one realization of the instant embodiment, the programmable data storage component (1000) may contain a second auxiliary ferroelectric capacitor (1040), which may be a data ferroelectric capacitor or a load ferroelectric capacitor, coupled to the second state node (1004), possibly through a second optional load capacitor isolation transistor (1042). In another realization, the programmable data storage component (1000) may contain a second optional load (1044) coupled to the second data ferroelectric capacitor (1032), possibly including a second optional load transistor (1046), a second optional load capacitor (1048) or a second optional load resistor (1050).

The first data ferroelectric capacitor (1012) may be polarized by applying a potential difference to the first state node (1002) and a first plate node (1052). The second data ferroelectric capacitor (1032) if present may be polarized by applying a potential difference to the second state node (1004) and a second plate node (1054). The first auxiliary ferroelectric capacitor (1020) if present may be polarized by applying a potential difference to the first state node (1002) and a first load plate node (1056). The second auxiliary ferroelectric capacitor (1040) if present may be polarized by applying a potential difference to the second state node (1004) and a second load plate node (1058).

The programmable data storage component (1000) includes the first data ferroelectric capacitor (1012) and at least one of the first auxiliary ferroelectric capacitor (1020), the second data ferroelectric capacitor (1032) and the second auxiliary ferroelectric capacitor (1040). Configuring the ferroelectric capacitors (1012, 1020, 1032, 1040) as described in reference to FIG. 1 may provide data retention when power is removed from the state circuit (1006). Other components which may be included in specific realizations of the programmable data storage component (1000), such as passgate transistors, bit data lines or word lines, are not shown in FIG. 1 for clarity.

Figure 1:
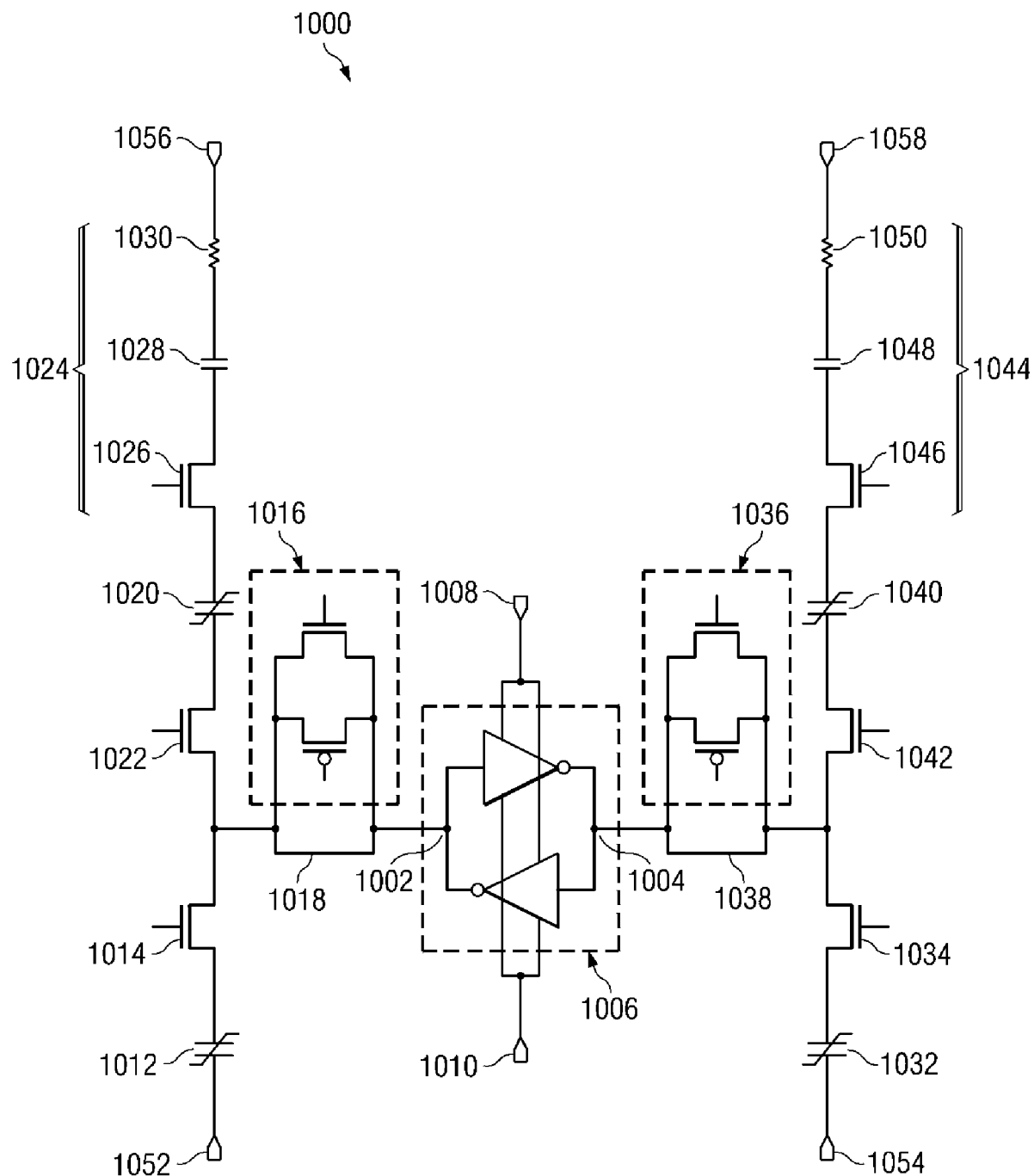
Figure 2:
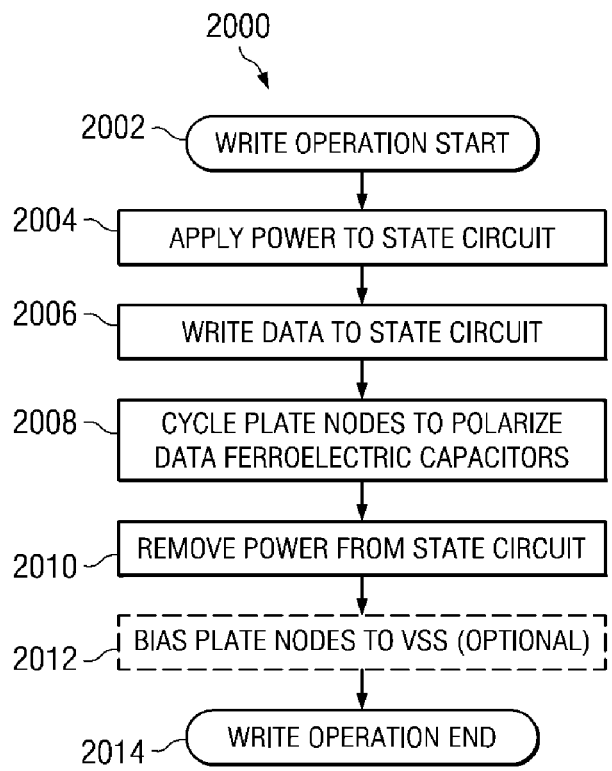

FIG. 2 is a flowchart (2000) of a data write operation according to an embodiment. The write operation depicted in FIG. 2 applies to a programmable data storage component as depicted in FIG. 1. The write operation begins (2002) with step (2004) which is to apply power to the state circuit (1006) by biasing the Vdd node (1008). Step (2006) is to write a data value to the state circuit, for example by applying appropriate data voltages to bit lines and turning on passgate transistors (not shown in FIG. 1). Step (2008) is to cycle biases on the plate nodes (1052, 1054, 1056, 1058) so as to polarize the data ferroelectric capacitors (1012, 1020, 1032, 1040) to provide retention of the data value. Subsequently, step (2010) is to remove power from the state circuit (1006) in a way that preserves the polarization orientations of the data ferroelectric capacitors (1012, 1020, 1032, 1040) from step (2008). Step (2010) is performed prior to any subsequent read or write step on the state circuit (1006). Subsequently, optional step (2012) may be executed, which is to reduce bias on the plate nodes (1052, 1054, 1056, 1058) to Vss. Subsequently, the write operation is ended (2014).

Figure 3:
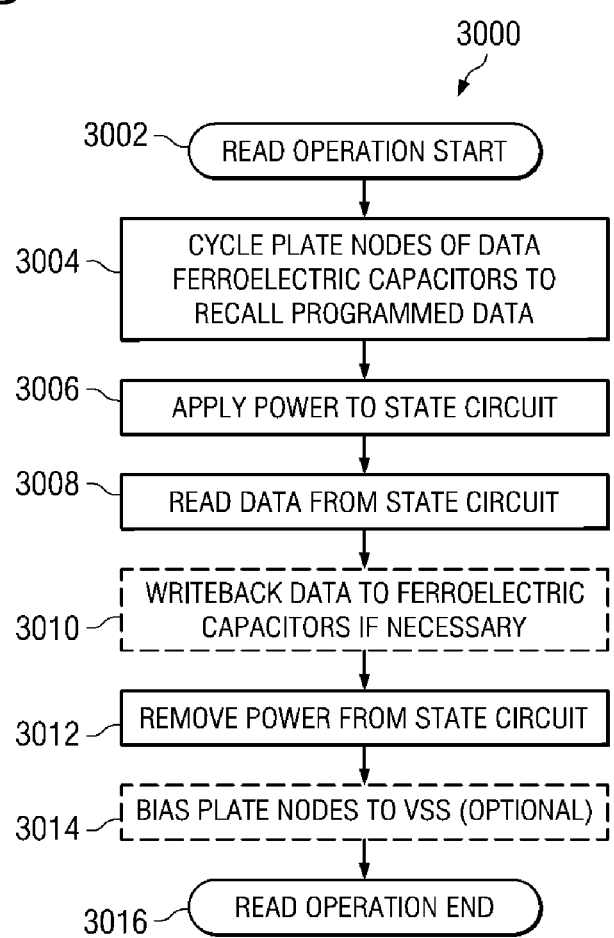

FIG. 3 is a flowchart (3000) of a data read operation according to an embodiment. The read operation depicted in FIG. 3 applies to a programmable data storage component as depicted in FIG. 1. The read operation begins (3002) with step (3004) which is to cycle biases on the plate nodes (1052, 1054, 1056, 1058) so as to recall a programmed data value to the state nodes (1002, 1004). Next, step (3006) is to apply power to the state circuit (1006) by biasing the Vdd node (1008) so that the data value stabilizes on the state nodes (1002, 1004). Next, step (3008) is to read the data value from the state circuit (1006), for example by turning on passgate transistors (not shown in FIG. 1) connected to the state nodes (1002, 1004). In some realizations of the instant embodiment, polarization configurations in the data ferroelectric capacitors (1012, 1020, 1032, 1040) may be degraded during step (3008). In these realizations, step (3010) may be executed, which is to write back the data value onto the data ferroelectric capacitors (1012, 1020, 1032, 1040) if needed. Subsequently, step (3012) is to remove power from the state circuit (1006) in a way that preserves the polarization orientations of the data ferroelectric capacitors (1012, 1020, 1032, 1040). Step (3012) is performed prior to any subsequent read or write step on the state circuit (1006). Subsequently, optional step (3014) may be executed, which is to reduce bias on the plate nodes (1052, 1054, 1056, 1058) to Vss. Subsequently, the write operation is ended (3016).

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of reading a programmable data storage component of an integrated circuit, comprising:
    cycling a bias on a first plate node coupled to a first data ferroelectric capacitor of said programmable data storage component, so as to recall a first programmed data value to a first state node and a second programmed data value to complementary second state node of a state circuit of said programmable data storage component, said first data ferroelectric capacitor being coupled to said first state node, and one of said first state node and said second state node being coupled to a second ferroelectric capacitor;
    applying power to said state circuit so that said first and second programmed data values stabilize on said first state node and said second state node;
    reading said first and second programmed data values from said state circuit; and
    removing power from said state circuit prior to any subsequent read or write step on said state circuit, so that a polarization orientation of said first data ferroelectric capacitor is preserved.

2. The process of claim 1, further including biasing said first plate node to Vss after said step of removing power from said state circuit.

3. The process of claim 1, further including writing back said first programmed data value onto said first data ferroelectric capacitor.

4. The process of claim 1, further including writing a data value to said programmable data storage component by a process including:
    applying power to said state circuit;
    writing said first programmed data value to said state circuit;
    cycling said bias on said first plate node so as to polarize said first data ferroelectric capacitor so as to provide retention of said first programmed data value; and
    removing power from said state circuit prior to any subsequent read or write step on said state circuit, so that a polarization orientation of said first data ferroelectric capacitor is preserved.

5. The process of claim 4, further including biasing said first plate node to Vss after said step of removing power from said state circuit in said writing process.

6. The process of claim 1, in which said second ferroelectric capacitor is a data capacitor coupled to said second state node, and said process further includes cycling a bias on a second plate node coupled to said second ferroelectric capacitor so as to recall said first and second programmed data values to said first state node and said second state node.

7. The process of claim 6, in which said programmable data storage component includes a third ferroelectric capacitor coupled to said first state node and includes a fourth ferroelectric capacitor coupled to said second state node.

8. The process of claim 7, in which:
    said third ferroelectric capacitor is a data ferroelectric capacitor;
    said fourth ferroelectric capacitor is a data ferroelectric capacitor; and
    said process further includes:
        cycling a bias on a third plate node coupled to said third ferroelectric capacitor, so as to recall said first and second programmed data values to said first state node and said second state node; and
        cycling a bias on a fourth plate node coupled to said fourth ferroelectric capacitor, so as to recall said first and second programmed data values to said first state node and said second state node.

9. The process of claim 1, in which said programmable data storage component is an F-SRAM cell.

10. The process of claim 1, in which said programmable data storage component is a logic latch.

11. A process of writing to a programmable data storage component of an integrated circuit, comprising:
applying power to a state circuit of said programmable data storage component, said state circuit having a first state node and a complementary second state node, said first state node being coupled to a first data ferroelectric capacitor, and one of said first state node and said second state node being coupled to a second ferroelectric capacitor;
writing a first data value and a second data value to said state circuit;
cycling a bias on a first plate node coupled to said first data ferroelectric capacitor so as to polarize said first data ferroelectric capacitor so as to provide retention of said data value; and
removing power from said state circuit prior to any subsequent read or write step on said state circuit, so that a polarization orientation of said first data ferroelectric capacitor is preserved.

12. The process of claim 11, further including biasing said first plate node to Vss after said step of removing power from said state circuit.

13. The process of claim 11, in which said second ferroelectric capacitor is a data capacitor coupled to said second state node, and said process further includes cycling a bias on a second plate node coupled to said second ferroelectric capacitor so as to recall said first and second data values to said first state node and said second state node.

14. The process of claim 13, in which said programmable data storage component includes a third ferroelectric capacitor coupled to said first state node and includes a fourth ferroelectric capacitor coupled to said second state node.

15. The process of claim 14, in which:
said third ferroelectric capacitor is a data ferroelectric capacitor;
said fourth ferroelectric capacitor is a data ferroelectric capacitor; and
said process further includes:
cycling a bias on a third plate node coupled to said third ferroelectric capacitor, so as to recall said first and second data values to said first state node and said second state node; and
cycling a bias on a fourth plate node coupled to said fourth ferroelectric capacitor, so as to recall said first and second data values to said first state node and said second state node.

16. The process of claim 11, in which said programmable data storage component is an F-SRAM cell.

17. The process of claim 11, in which said programmable data storage component is a logic latch.

18. A process of operating an integrated circuit containing a programmable data storage component, comprising:
reading a first and second programmed data value from said programmable data storage component by a process including:
cycling a bias on a first plate node coupled to a first data ferroelectric capacitor of said programmable data storage component, so as to recall said first programmed data value to a first state node and said second programmed data value to a complementary second state node of a state circuit of said programmable data storage component, said first data ferroelectric capacitor being coupled to said first state node;
cycling a bias on a second plate node coupled to a second data ferroelectric capacitor of said programmable data storage component, so as to recall said first and second programmed data values to said first state node and said second state node, said second data ferroelectric capacitor being coupled to said second state node;
cycling a bias on a third plate node coupled to a third data ferroelectric capacitor of said programmable data storage component, so as to recall said first and second programmed data values to said first state node and said second state node, said third data ferroelectric capacitor being coupled to said first state node;
cycling a bias on a fourth plate node coupled to a fourth data ferroelectric capacitor of said programmable data storage component, so as to recall said first and second programmed data values to said first state node and said second state node, said fourth data ferroelectric capacitor being coupled to said second state node;
applying power to said state circuit so that said first and second programmed data values stabilize on said first state node and said second state node;
reading said first and second programmed data values from said state circuit;
removing power from said state circuit prior to any subsequent read or write step on said state circuit, so that a polarization orientation of said first data ferroelectric capacitor is preserved;
biasing said first plate node to Vss;
biasing said second plate node to Vss;
biasing said third plate node to Vss; and
biasing said fourth plate node to Vss; and
writing a first and second data value to said programmable data storage component by a process including:
applying power to said state circuit;
writing said first and second data value to said state circuit;
cycling said bias on said first plate node so as to polarize said first data ferroelectric capacitor so as to provide retention of said first and second data values;
cycling said bias on said second plate node so as to polarize said second data ferroelectric capacitor so as to provide retention of said first and second data values;
cycling said bias on said third plate node so as to polarize said third data ferroelectric capacitor so as to provide retention of said first and second data values;
cycling said bias on said fourth plate node so as to polarize said fourth data ferroelectric capacitor so as to provide retention of said first and second data values;
removing power from said state circuit prior to any subsequent read or write step on said state circuit, so that a polarization orientation of said first data ferroelectric capacitor is preserved;
biasing said first plate node to Vss;
biasing said second plate node to Vss;
biasing said third plate node to Vss; and
biasing said fourth plate node to Vss.

19. The process of claim 18, in which said programmable data storage component is an F-SRAM cell.

20. The process of claim 18, in which said programmable data storage component is a logic latch.

* * * * *